United States Patent

Takiguchi

Patent Number: 5,958,576
Date of Patent: Sep. 28, 1999

[54] MAGNETORESISTANCE EFFECT DEVICE AND MAGNETIC HEAD

[75] Inventor: Masafumi Takiguchi, Kanagawa, Japan

[73] Assignee: Sony Corporation, Tokyo, Japan

[21] Appl. No.: 08/926,939

[22] Filed: Sep. 10, 1997

[30] Foreign Application Priority Data

Sep. 13, 1996 [JP] Japan .................................. 8-243799
Feb. 10, 1997 [JP] Japan .................................. 9-027065

[51] Int. Cl.⁶ ........................................................ G11B 5/66
[52] U.S. Cl. .......................... 428/332; 428/336; 428/611; 428/692; 428/694 R; 428/694 TR; 428/694 T; 428/694 TS; 428/694 TM; 428/900; 360/113; 324/252
[58] Field of Search ................. 428/611, 694 R, 428/694 TR, 694 T, 694 TS, 694 TM, 900, 332, 692, 336; 360/113; 324/252

[56] References Cited

U.S. PATENT DOCUMENTS 5,549,978 8/1996 Iwasaki .................................. 428/692

*Primary Examiner*—Leszek Kiliman
*Attorney, Agent, or Firm*—Hill & Simpson

[57] ABSTRACT

A magnetoresistance effect device and a magnetic head according to the present invention exhibit preferable magnetic characteristics and an excellent corrosion resistance.

The magnetoresistance effect device includes an antiferromagnetic body formed in a fcc (face-centered cubic) structure and in an irregular phase and having a composition of $A_X$—$Mn_{1-X}$ wherein A is at least one of Rh and Ru, and X is in a range from 0.05 to 0.25; and a ferromagnetic body whose magnetization state is controlled by the antiferromagnetic body.

Moreover, the magnetic head includes an antiferromagnetic body formed in a fcc (face-centered cubic) structure and in an irregular phase and having a composition of $A_XMn_{1-X}$ wherein A is at least one of Rh and Ru, and X is in a range from 0.05 to 0.25; and a ferromagnetic body whose magnetization state is controlled by the antiferromagnetic body.

11 Claims, 10 Drawing Sheets

Rh-Mn33nm/Ni-Fe20nm/Ta6nm ON GLASS

Ta(10.0nm)/RhMn(t nm)/NiFe(20.0nm)/Ta(5.0nm)

Ta(10.0nm)/RhMn(t nm)/CoFe(2.2nm)/Cu(2.5nm)
/CoFe(2.0nm)/NiFe(6.3nm)/Ta(5.0nm)

MAGNETORESISTANCE EFFECT DEVICE AND MAGNETIC HEAD

BACKGROUND OF THE INVENTION

1. Field of the Invention

The present invention relates to a magnetoresistance effect device which changes its resistance value according to an external magnetic field, and a magnetic head using the magnetoresistance effect device.

2. Description of the Prior Art

The magnetoresistance device (hereinafter, referred to as MR device) is a device which changes its resistance value according to an external magnetic field, and is used for a magnetic head for reproducing a signal recorded on a magnetic recording medium and a magnetic sensor for detecting intensity and direction of an external magnetic field.

Such an MR device may be an AMR device utilizing the anisotropic magnetoresistance effect or a GMR device utilizing the giant magnetoresistance effect.

The AMR device is a device which uses a ferromagnetic body exhibiting the anisotropic magnetoresistance effect. The ferromagnetic body used in the AMR device preferably has a single domain so as to reduce the Barkhausen noise caused by movement of a domain wall. As an AMR device which reduces the Barkhausen noise, there has been suggested an AMR device in which an antiferromagnetic body is provided adjacent to a ferromagnetic body exhibiting the anisotropic magnetoresistance effect. In the AMR device of such configuration, the exchange interaction between the antiferromagnetic body and the ferromagnetic body controls a domain of the ferromagnetic body so as to establish a single domain, suppressing the Barkhausen noise caused by a domain wall.

On the other hand, the GMR device is a device which has a layered structure and changes its resistance value according to the giant magnetoresistance effect, and normally exhibits a larger resistance change than the AMR device. The GMR can be divided into two main types: a device having a comparatively complicated structure, i.e., superstructure and a device having a comparatively simple structure, i.e., spin bulb structure and changing its resistance value in a weak magnetic field.

The GMR device of the spin bulb structure at least has a first ferromagnetic layer, a non-magnetic layer, and a second ferromagnetic layer, which are successively stacked on each other. That is, in the GMR device of the spin bulb structure, the first ferromagnetic layer is separated from the second ferromagnetic layer by a thin non-magnetic layer, and an antiferromagnetic layer is provided on the first ferromagnetic layer.

In the GMR device, the first ferromagnetic layer adjacent to the antiferromagnetic layer has a fixed magnetization direction because of a magnetic connection with the antiferromagnetic layer, whereas the second ferromagnetic layer adjacent to the non-magnetic layer readily changes its magnetization direction according to an external magnetic field.

When the GMR device having such a configuration is subjected to an external magnetic field, the first ferromagnetic layer does not change its magnetization direction, and the second ferromagnetic layer alone changes its magnetization direction. The resistance value increases as an angle defined by the magnetization direction of the first ferromagnetic layer and the magnetization direction of the second ferromagnetic layer increases. This is because electrons which move between the first ferromagnetic layer and the second ferromagnetic layer are scattered in the boundary between the non-magnetic layer and first ferromagnetic layer and in the boundary between the non-magnetic layer and the second ferromagnetic layer.

As has been described above, in the AMR device and the GMR device, an antiferromagnetic body is used so as to control the magnetization state of the magnetic bodies in the device. Such an antiferromagnetic body conventionally used is an Fe-Mn alloy having a structure of a face-centered cubic (hereinafter, referred to as fcc structure). However, the Fe-Mn alloys have a problem that corrosion is easily caused by oxidation or the like.

Consequently, for example, when a magnetic head employing an MR device using an Fe-Mn alloy is produced, an antiferromagnetic layer made from the Fe-Mn alloy corrodes through oxidation or the like during an MR head production step, and it is impossible to obtain a preferable magnetic property.

To cope with this, there has been suggested to use a Ni-Mn alloy, Cr-Mn alloy, or NiO which is already an oxide, instead of the Fe-Mn alloy.

However, when such an antiferromagnetic body is provided adjacent to a ferromagnetic body so as to control the magnetization state, the antiferromagnetic layer should have a thickness required for obtaining an adequate magnetic property, which is about three times or more of the case when an antiferromagnetic body such as an Fe-Mn alloy is used. That is, it is necessary to increase the layer thickness when using a Ni-Mn alloy, Cr-Mn alloy, or NiO for controlling the magnetization state of the ferromagnetic body in the MR device.

Further, when an MR device having such an antiferromagnetic layer of increased thickness is employed in a magnetic head for reproduction, the magnetic gap for reproduction is also widened. That is, in a magnetic head using an MR device, a spacing between the magnetic shields provided at the both ends of the MR device is increased. This leads to that when reproducing a magnetic recording medium of a high recording density, a signal magnetic field other than those to be reproduced is also detected by this magnetic head. Thus, it is difficult to employ an MR device using an antiferromagnetic body requiring a large thickness, to a magnetic head for reproducing a magnetic recording medium having a high recording density.

SUMMARY OF THE INVENTION

It is therefore an object of the present invention to provide a magnetoresistance effect device which has a high corrosion resistance and exhibits a preferable magnetic property with a comparatively small thickness as well as a magnetic head provided with such a magnetoresistance effect device.

The magnetoresistance effect device according to the present invention which achieves the aforementioned object has an antiferromagnetic body and a ferromagnetic body whose magnetization state is controlled by the antiferromagnetic body, wherein the antiferromagnetic body has a composition: $A_X$—$Mn_{1-X}$ (wherein A is Rh or Ru; and X is in a range from 0.05 to 0.25).

In the magnetoresistance effect device thus constructed, the antiferromagnetic body exhibits a preferable magnetic property to the ferromagnetic body, and a preferable corrosion resistance.

Moreover, a magnetic head according to the present invention is provided with a magnetoresistance effect device having an antiferromagnetic body and a ferromagnetic body whose magnetization state is controlled by this antiferromagnetic body, wherein the antiferromagnetic body has a composition as $A_X$—$Mn_{1-X}$ (wherein A is one of Rh and Ru; and X is in a range from 0.05 to 0.25).

In the magnetic head having such configuration, the antiferromagnetic body exhibits a preferable magnetic property for the ferromagnetic body, and the magnetoresistance effect device exhibits a preferable corrosion resistance.

DETAILED DESCRIPTION OF PREFERRED EMBODIMENTS

Description will now be directed to a magnetoresistance effect device and magnetic head according to the present invention with reference to the attached drawings. It should be noted that the present invention will not be limited to embodiments given below, but can be modified in various ways within the scope of invention.

The magnetoresistance effect device (hereinafter, referred to as MR device) according to the present invention has an antiferromagnetic layer made from a Rh-Mn alloy or Ru-Mn alloy and a ferromagnetic layer whose magnetization state is controlled by this antiferromagnetic layer. Hereinafter, explanation will be given on the magnetic property of a magnetic film composed of such an antiferromagnetic layer and a ferromagnetic layer.

The antiferromagnetic layer is made from a Rh-Mn alloy or a Ru-Mn alloy having a face-centered cubic lattice (hereinafter, referred to as fcc lattice), which is formed, in the irregular phase, adjacent to the ferromagnetic layer. The antiferromagnetic layer is formed so as to be stacked on the ferromagnetic layer and generates an exchange connection magnetic field for the ferromagnetic layer.

The Rh-Mn alloy or the Ru-Mn alloy used in this antiferromagnetic layer has a composition which can be expressed as $A_X$—$Mn_{1-X}$ (wherein A is one of Rh and Ru; and X is in a range from 0.05 to 0.25). It is also possible to add to the alloy a small quantity of at least one element selected from a group consisting of Ir, Rh, Pt, Pd, Ni, Cu, Os, Ru, Re, and Cr so as to replace Rh or Ru. By adding these elements, it is possible to increase the corrosion resistance of the antiferromagnetic layer.

The ferromagnetic layer is formed adjacent to the antiferromagnetic layer and changes its magnetization direction by the exchange coupling magnetic field from the antiferromagnetic layer. This ferromagnetic layer, for example, is made as a single Ni-Fe layer or as double layers made from a Co-Fe layer and a Ni-Fe layer.

Firstly, explanation will be given on a case using a Rh-Mn alloy for the antiferromagnetic layer for forming a magnetic film having the aforementioned configuration.

Figure 1:
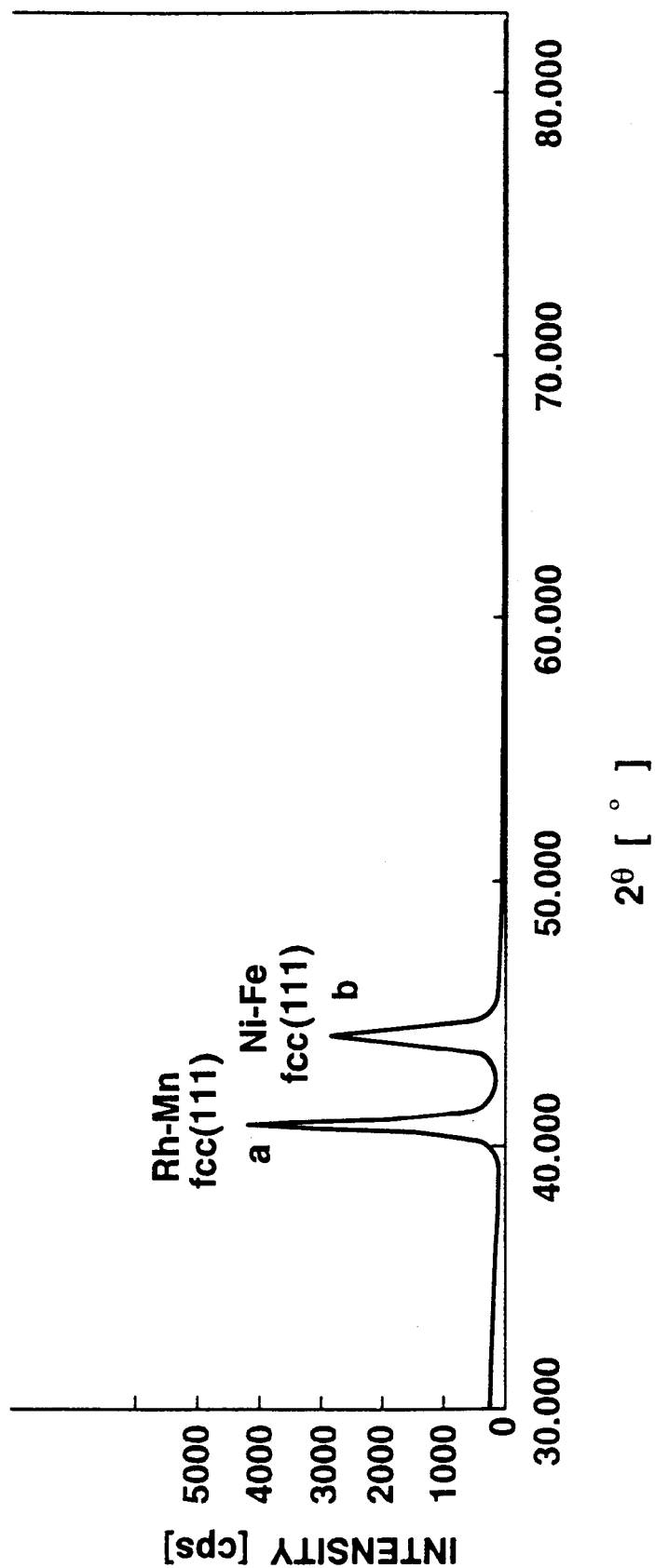
FIG. 1 shows an X-ray diffraction pattern of a magnetic film having an antiferromagnetic layer made from a Rh-Mn alloy and a ferromagnetic layer.

FIG. 1 shows an X-ray diffraction pattern of a magnetic film composed of an antiferromagnetic layer and a ferromagnetic layer. Note that FIG. 1 shows an X-ray diffraction pattern of a magnetic film formed on a glass substrate by about 33 nm thickness of Rh-Mn, about 20 nm thickness of Ni-Fe, and about 6 nm thickness of Ta. This X-ray diffraction pattern has a peak "a" generated at an angle indicating fcc (1 1 1) of Rh-Mn and another peak "b" generated at an angle indicating fcc (1 1 1) of Ni-Fe. That is, this X-ray diffraction pattern shows that the antiferromagnetic layer and the ferromagnetic layer have a crystalline structure of fcc lattice. This means that in this magnetic film, the antiferromagnetic layer of fcc lattice has grown epitaxially with respect to the ferromagnetic layer.

The antiferromagnetic layer thus formed in fcc lattice with an irregular phase formed on the ferromagnetic layer is made from Rh-Mn, which makes the antiferromagnetic layer difficult to be oxidized and exhibits an excellent corrosion resistance. Moreover, because this antiferromagnetic layer grows epitaxially on the ferromagnetic layer, it is possible to make the film thickness small.

Figure 2:
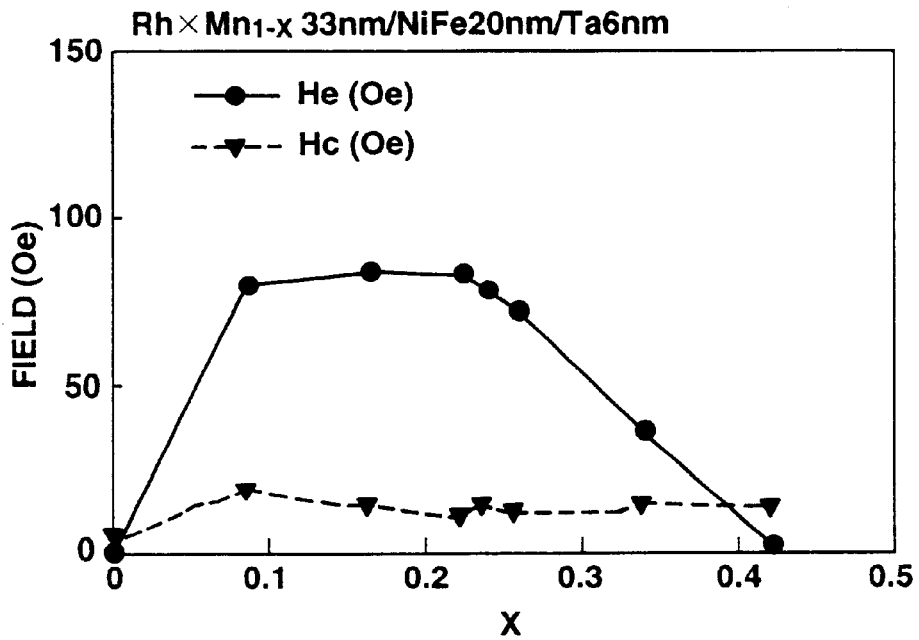
FIG. 2 shows the relationship between the composition of the Rh-Mn alloy and the exchange coupling magnetic field as well as the coercive force in a magnetic film having Rh-Mn, Ni-Fe, and Ta layers.

As an example of a magnetic film composed of such an antiferromagnetic layer and a ferromagnetic layer, there was prepared a magnetic film composed of $Rh_X$—$Mn_{1-X}$ having about 33 nm thickness, Ni-Fe having about 20 nm thickness, and Ta having about 6 nm thickness, and the exchange coupling magnetic field $H_e$ and the coercive force $H_c$ thereof were measured. The results of the measurements are shown in FIG. 2. FIG. 2 shows the exchange coupling magnetic field He obtained by varying X from 0 to 0.42 in $Rh_X$—$Mn_{1-X}$, which is the composition of the antiferromagnetic layer, and the coercive force Hc induced in the ferromagnetic layer.

Figure 3:
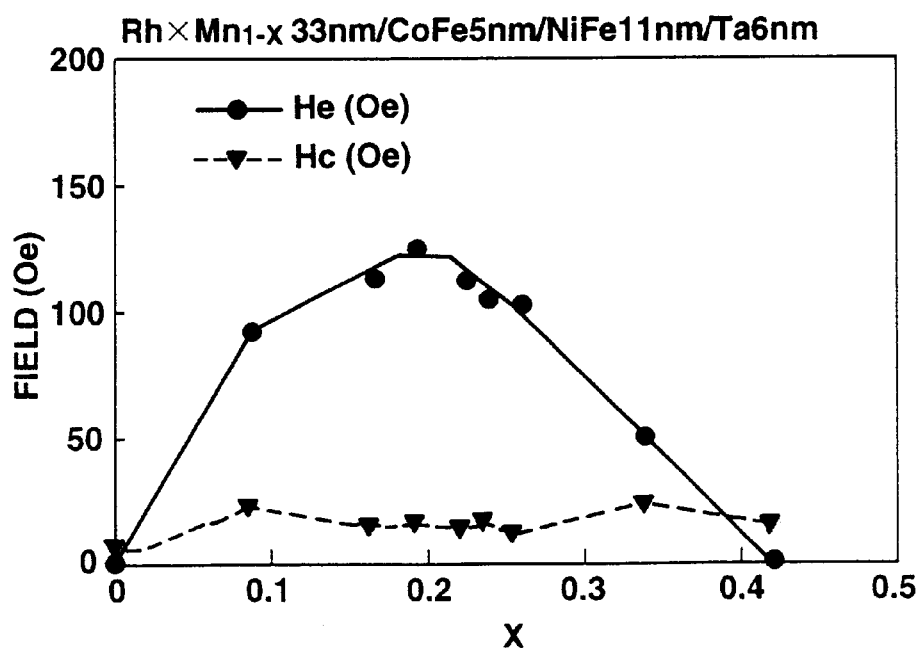
FIG. 3 shows the relationship between the composition of the Rh-Mn alloy and the exchange coupling magnetic field as well as the coercive force in a magnetic film having Rh-Mn, Co-Fe, Ni-Fe, and Ta layers.

As an another example of the magnetic film composed of such an antiferromagnetic layer and a ferromagnetic layer, there was prepared a magnetic film composed of $Rh_X$—$Mn_{1-X}$ having about 33 nm thickness, Co-Fe having about 5 nm thickness, Ni-Fe having about 11 nm thickness, and Ta having about 6 nm thickness, and the exchange coupling magnetic field $H_e$ and the coercive force $H_c$ thereof were measured. The results of the measurements are shown in FIG. 3. FIG. 3 shows the exchange coupling magnetic field He obtained by varying X from 0 to 0.42 in $Rh_X$—$Mn_{1-X}$, which is the composition of the antiferromagnetic layer, and the coercive force $H_c$ induced in the ferromagnetic layer.

As shown in FIG. 2 and FIG. 3 which represent the magnetic film composed of an antiferromagnetic layer and a ferromagnetic layer, when the X is in a range from 0.05 to 0.25 in the composition $Rh_X$—$Mn_{1-X}$ of the antiferromagnetic layer, the exchange coupling magnetic field $H_e$ is increased and the coercive force $H_c$ induced by the ferromagnetic layer is decreased. That is, in these magnetic films, a sufficient magnetic connection between the antiferromagnetic layer and the ferromagnetic layer can be obtained by forming the layers so that X is in the range from 0.05 to 0.25.

Especially in the case of FIG. 3 where the ferromagnetic layer consists of two layers: Co-Fe having about 5 nm thickness and Ni-Fe having about 11 nm thickness, the exchange coupling magnetic field $H_e$ by the antiferromagnetic layer reaches its peak when the X value is approximately 0.2. Consequently, when the ferromagnetic layer consists of two layers: Co-Fe having about 5 nm thickness and Ni-Fe having about 11 nm thickness, the optimal composition of the antiferromagnetic layer is $Rh_{0.2}$—$Mn_{0.8}$, when an increased exchange coupling magnetic field $H_e$ can be applied to the ferromagnetic layer.

Figure 4:
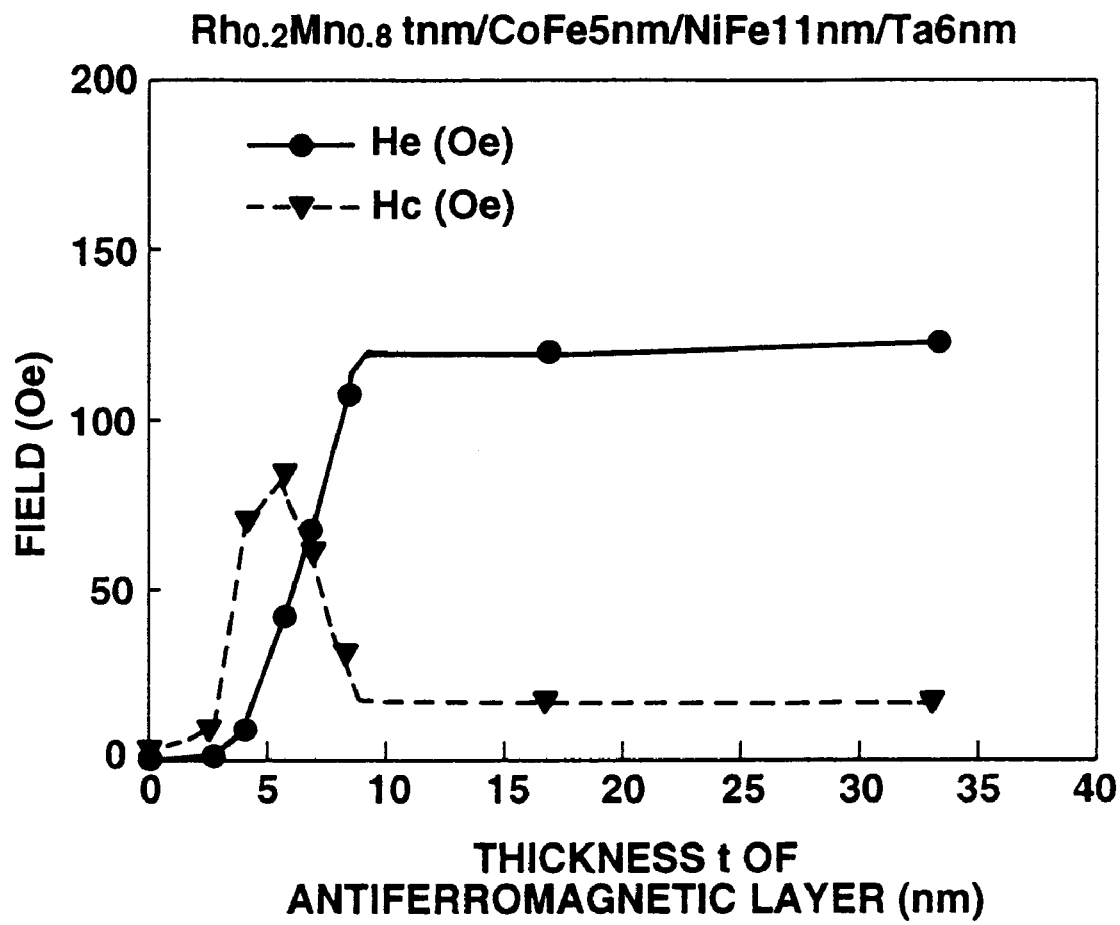
FIG. 4 shows the relationship between the thickness of the antiferromagnetic layer made from a Rh-Mn alloy and the exchange coupling magnetic field as well as the coercive force.

FIG. 4 shows the relationship between the magnetic property of the magnetic film composed by an antiferromagnetic layer and a ferromagnetic layer, and the thickness of the antiferromagnetic layer of the magnetic film. In FIG. 4, the vertical axis represents the exchange coupling magnetic field He by the antiferromagnetic layer and the coercive force Hc induced by the ferromagnetic layer; whereas the horizontal axis represents the thickness of the antiferromagnetic layer.

The magnetic film checked here is made from a Rh-Mn layer, a Co-Fe layer which is about 5 nm thick, a Ni-Fe layer which is about 11 nm thick, and a Ta layer which is bout 6 nm thick. The antiferromagnetic layer has the optimal composition $Rh_{0.2}$—$Mn_{0.8}$ which was obtained from the result of FIG. 3.

According to this FIG. 4, the exchange coupling magnetic field $H_e$ of the Rh-Mn which is the antiferromagnetic layer is increased abruptly at the thickness of about 5 nm, reaching about 120 [Oe] at about 10 nm, indicating the peak value in FIG. 3. On the other hand, the coercive force $H_c$ induced by a double layered structure of Co-Fe having about 5 nm thickness and Ni-Fe having about 11 nm thickness is significantly high at about 5 nm thickness of the antiferromagnetic, and is decreased to about 20 [Oe] when the thickness of the antiferromagnetic layer is equal to or more than 10 nm.

Consequently, in this magnetic film, by making the thickness of the antiferromagnetic layer 10 nm or above, it is possible to apply to the adjacent ferromagnetic layer a large exchange coupling magnetic field $H_e$ as well as decrease the coercive force $H_c$ induced by the ferromagnetic layer.

In the magnetic film consisting of an antiferromagnetic layer and a ferromagnetic layer and exhibiting the aforementioned magnetic characteristics, it is possible to apply to the ferromagnetic layer a large exchange coupling magnetic field by defining X to be in a range from 0.05 to 0.25, assuming the composition of the antiferromagnetic layer to be $Rh_X$—$Mn_{1-X}$.

Subsequently, description will be directed to the magnetic characteristics of the magnetic film using a Ru-Mn alloy in the antiferromagnetic layer.

Figure 5:
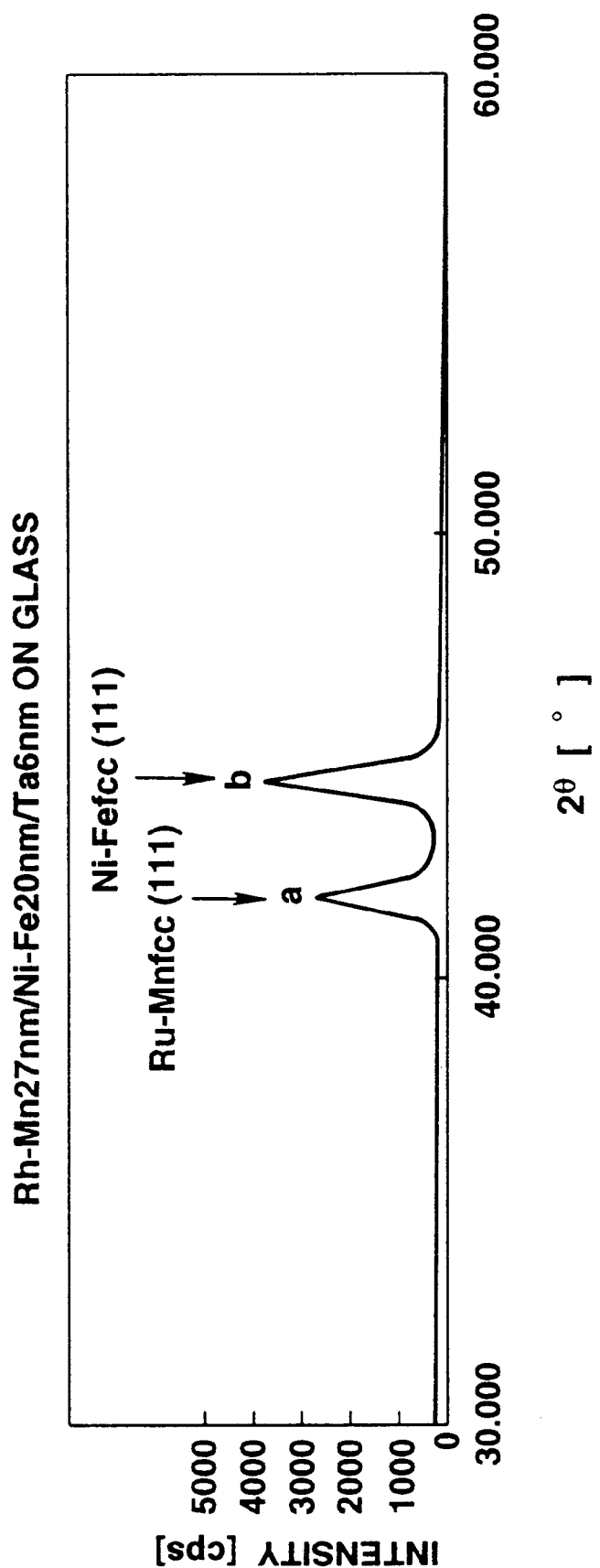
FIG. 5 shows an X-ray diffraction pattern of a magnetic film having an antiferromagnetic layer made from a Ru-Mn alloy and a ferromagnetic layer.

FIG. 5 shows an X-ray diffraction pattern of a magnetic film composed of an antiferromagnetic layer and a ferromagnetic layer. Note that FIG. 1 shows an X-ray diffraction pattern of a magnetic film formed on a glass substrate by about 27 nm thickness of Ru-Mn, about 20 nm thickness of Ni-Fe, and about 6 nm thickness of Ta. This X-ray diffraction pattern has a peak "a" generated at an angle indicating fcc (1 1 1) of Ru-Mn and another peak "b" generated at an angle indicating fcc (1 1 1) of Ni-Fe. That is, this X-ray diffraction pattern shows that the antiferromagnetic layer and the ferromagnetic layer have a crystalline structure of fcc lattice. This means that in this magnetic film, the antiferromagnetic layer of fcc lattice has grown epitaxially with respect to the ferromagnetic layer.

The antiferromagnetic layer thus formed in fcc lattice with an irregular phase formed on the ferromagnetic layer is made from Ru-Mn, which makes the antiferromagnetic layer difficult to be oxidized and exhibits an excellent corrosion resistance. Moreover, because this antiferromagnetic layer grows epitaxially on the ferromagnetic layer, it is possible to make the film thickness small.

Figure 6:
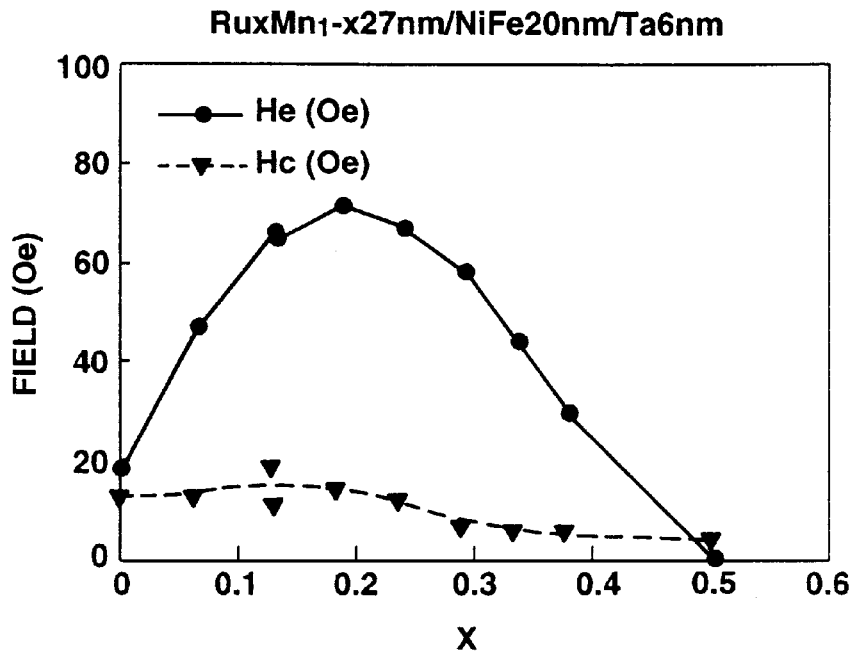
FIG. 6 shows the relationship between the composition of the Ru-Mn alloy and the exchange coupling magnetic field as well as the coercive force in a magnetic film having Ru-Mn, Ni-Fe, and Ta layers.

As an example of a magnetic film composed of such an antiferromagnetic layer and a ferromagnetic layer, there was prepared a magnetic film composed of $Ru_X$—$Mn_{1-X}$ having about 27 nm thickness, Ni-Fe having about 20 nm thickness, and Ta having about 6 nm thickness, and the exchange coupling magnetic field $H_e$ and the coercive force $H_c$ thereof were measured. The results of the measurements are shown in FIG. 6. FIG. 6 shows the exchange coupling magnetic field He obtained by varying X from 0 to 0.5 in $Ru_X$—$Mn_{1-X}$, which is the composition of the antiferromagnetic layer, and the coercive force $H_c$ induced in the ferromagnetic layer.

As shown in FIG. 6 which represent the magnetic film composed of an antiferromagnetic layer and a ferromagnetic layer, when the X is in a range from 0.05 to 0.25 in the composition $Ru_X$—$Mn_{1-X}$ of the antiferromagnetic layer, the exchange coupling magnetic field $H_e$ is increased and the coercive force $H_c$ induced by the ferromagnetic layer is decreased. That is, in these magnetic films, a sufficient magnetic connection between the antiferromagnetic layer and the ferromagnetic layer can be obtained by forming the layers so that X is in the range from 0.05 to 0.25.

Especially in the case of FIG. 6, the exchange coupling magnetic field $H_e$ by the antiferromagnetic layer reaches its peak when the X value is approximately 0.18. Consequently, the optimal composition of the antiferromagnetic layer is $Ru_{0.18}$—$Mn_{0.82}$, when an increased exchange coupling magnetic field He can be applied to the ferromagnetic layer.

Figure 7:
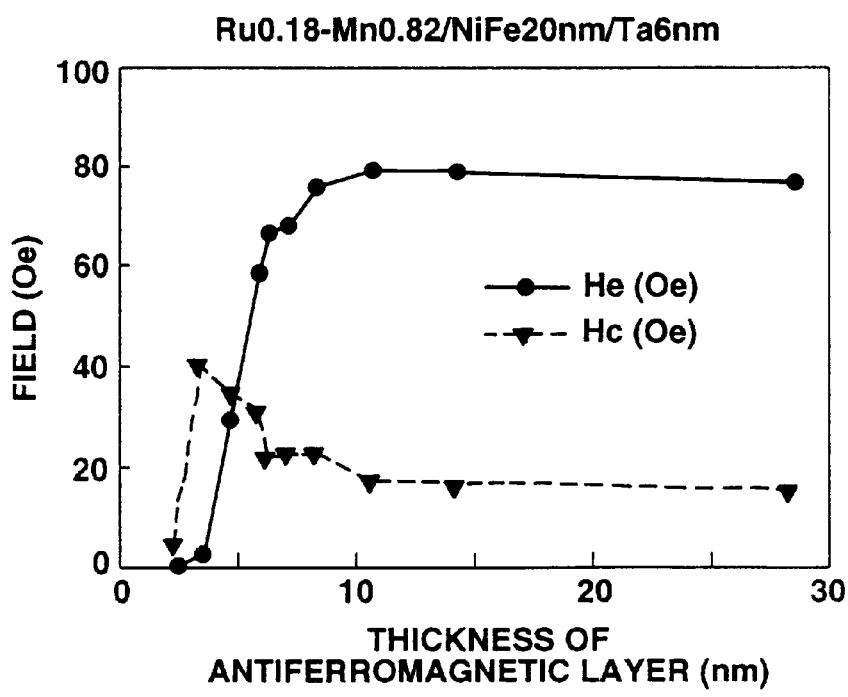
FIG. 7 shows the relationship between the thickness of the antiferromagnetic layer made from a Ru-Mn alloy and the exchange coupling magnetic field as well as the coercive force.

FIG. 7 shows the relationship between the magnetic property of the magnetic film composed by an antiferromagnetic layer and a ferromagnetic layer, and the thickness of the antiferromagnetic layer of the magnetic film. In FIG. 7, the vertical axis represents the exchange coupling magnetic field $H_e$ by the antiferromagnetic layer and the coercive force $H_c$ induced by the ferromagnetic layer; whereas the horizontal axis represents the thickness of the antiferromagnetic layer.

The magnetic film checked here is made from a Ru-Mn layer, a Ni-Fe layer which is about 20 nm thick, and a Ta layer which is bout 6 nm thick. The antiferromagnetic layer has the optimal composition $Ru_{0.18}$—$Mn_{0.82}$ which was obtained from the result of FIG. 6.

According to this FIG. 7, the exchange coupling magnetic field $H_e$ of the Ru-Mn which is the antiferromagnetic layer is increased abruptly at the thickness of about 4 nm, reaching about 70 [Oe] at about 8 nm, indicating the peak value in FIG. 6. On the other hand, the coercive force $H_c$ induced by Ni-Fe layer having about 20 nm thickness is significantly high at about 4 nm thickness of the antiferromagnetic, and is decreased to about 20 [Oe] when the thickness of the antiferromagnetic layer is equal to or more than 8 nm.

Consequently, in this magnetic film, by making the thickness of the antiferromagnetic layer 8 nm or above, it is possible to apply to the adjacent ferromagnetic layer a large exchange coupling magnetic field $H_e$ as well as decrease the coercive force $H_c$ induced by the ferromagnetic layer.

In the magnetic film consisting of an antiferromagnetic layer and a ferromagnetic layer and exhibiting the aforementioned magnetic characteristics, it is possible to apply to the ferromagnetic layer a large exchange coupling magnetic field by defining the X in a range from 0.05 to 0.25, assuming the composition of the antiferromagnetic layer to be $Ru_x$—$Mn_{1-x}$.

Figure 8:
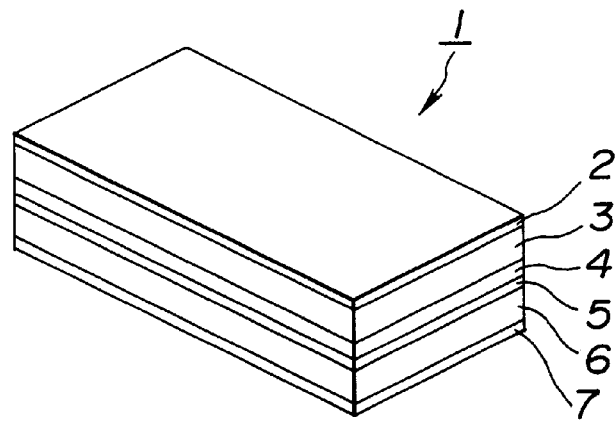
FIG. 8 is a perspective view showing a GMR device according to an embodiment of the present invention.

Description will now be directed to a case in which the aforementioned magnetic film consisting of an antiferromagnetic layer and a ferromagnetic layer is applied to a GMR device having a spin bulb structure as shown in FIG. 8.

FIG. 8 shows a GMR device 1 having: a protection layer 2; an antiferromagnetic layer 3 made from a Rh-Mn alloy or Ru-Mn alloy; a first ferromagnetic layer 4 made from a ferromagnetic substance whose magnetization direction is controlled by the antiferromagnetic layer 3; a non-magnetic layer 5; a second ferromagnetic layer 6 which can be magnetized in any direction and whose magnetization direction is changed by an external magnetic field; and a bottom layer 7. In this GMR device 1, the magnetization direction of the first ferromagnetic layer 4 intersects the magnetization direction of the second ferromagnetic layer 6 approximately orthogonally when no external magnetic field is applied.

When an external magnetic field is applied to this GMR device 1, the second ferromagnetic layer 6 changes its magnetization direction, whereas the first ferromagnetic layer 4 remains without changing its magnetization direction. Consequently, in this GMR device 1, an external magnetic field changes an angle defined by the magnetization direction of the second ferromagnetic layer 6 and the magnetization direction of the first ferromagnetic layer 3. When the angle changes, the electron scattering state also changes in the boundary between the first ferromagnetic layer 3 and the non-magnetic layer 5, and in the boundary between the second ferromagnetic layer 6 and the non-magnetic layer 5. As a result, the magnetoresistance of the GMR 1 is changed.

The non-magnetic layer 5 is made from Cu and formed adjacent to the first ferromagnetic layer 4 and the second ferromagnetic layer 6. Note that the non-magnetic layer 5 is not limited to Cu but can be other material which can generate electron scattering in the boundary with the adjacent first ferromagnetic layer 4 and in the boundary with the second ferromagnetic layer 6.

The second ferromagnetic layer 6 is formed so as to be adjacent to the non-magnetic layer 5 and the bottom layer 7. This second ferromagnetic layer 6 is made from a ferromagnetic substance. Because this second ferromagnetic layer 6 is formed adjacent to the non-magnetic layer 5 and the bottom layer 7, its magnetization direction is changed by an external magnetic field. The second ferromagnetic layer 6 may have either a single-layered structure or a double-layered structure consisting of a Co-Fe layer and a Ni-Fe layer.

The GMR device 1 of such configuration is formed by successively forming on a substrate (not depicted) the bottom layer 7, the second ferromagnetic layer 6, the non-magnetic layer 5, the first ferromagnetic layer 4, the antiferromagnetic layer 3, and the protection layer 2 in this order. After each of the layers is formed, the magnetization direction of the first ferromagnetic layer 4 and that of the second ferromagnetic layer 6 are defined.

Here, explanation will be given on a procedure to define the magnetization direction of the first ferromagnetic layer 4 and that of the second ferromagnetic layer 6. Firstly, the GMR device 1 with formed layers is heated to a predetermined temperature of the second ferromagnetic layer 6. In this state, the magnetic field is oriented in a predetermined direction. After this, the second ferromagnetic layer 6 has an axis of easy magnetization in the predetermined direction.

Subsequently, the temperature is gradually decreased and when the temperature has reached a predetermined temperature, the magnetic field is oriented so as to approximately orthogonally intersect the axis of easy magnetization of the second ferromagnetic layer 6. After this step, the antiferromagnetic layer 3 fixes the magnetization direction of the first ferromagnetic layer 4 in the direction which approximately orthogonally intersects the axis of easy magnetization of the second ferromagnetic layer 6.

Figure 9:
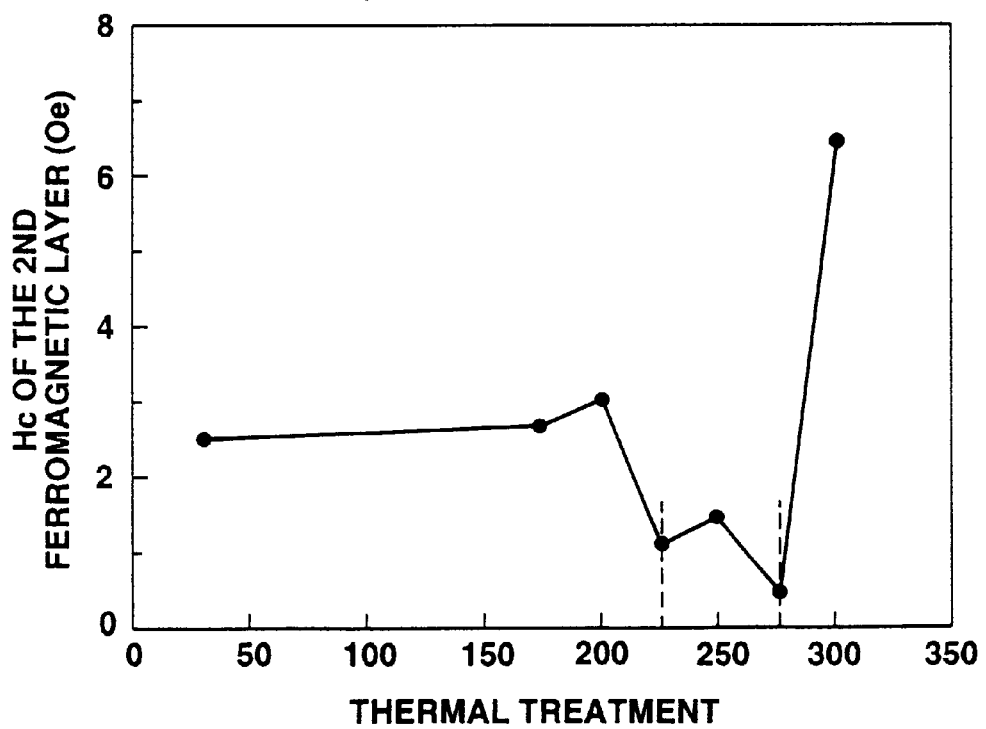
FIG. 9 shows the relationship between the temperature of thermal treatment of the second ferromagnetic layer and the coercive force of the second ferromagnetic layer.

FIG. 9 shows the relationship between the coercive force (Hc) of the second ferromagnetic layer and the temperature used for treatment in the case of GMR device 1 having a protection layer 2 of 10 nm thickness, the antiferromagnetic layer 3 of 10.0 nm thickness, the first ferromagnetic layer 4 of 2.2 nm thickness, the non-magnetic layer 5 of 2.5 nm thickness, the second ferromagnetic layer 6 of 3.8 nm thickness, and the bottom layer 7 of 5.0 nm thickness. As can be understood from this FIG. 9, after heating 225 to 275° C. and the axis of easy magnetization is defined, the second ferromagnetic layer 6 has a comparatively small coercive force (Hc).

Thus, the GMR device 1 is heated to a temperature range of 225 to 275@C. and subjected to a magnetic field in a predetermined direction. As a result, the second ferromagnetic layer 6 has the axis of easy magnetization in the predetermined direction, and the coercive force is defined as small.

Next, the temperature of the GMR device 1 is gradually decreased, and at the temperature or above the temperature of the blocking temperature of the antiferromagnetic layer, a magnetic field is applied in a direction intersecting approximately orthogonally the axis of easy magnetization of the second ferromagnetic layer 6. In this state, the GMR device 1 is gradually cooled down to the temperature of or below the temperature of the blocking temperature of the antiferromagnetic layer 3, when the direction of the exchange coupling magnetic field is defined. By this, the first ferromagnetic layer 5 has a magnetization direction fixed in a direction intersection approximately orthogonally the axis of easy magnetization of the second ferromagnetic layer 6.

Figure 10:
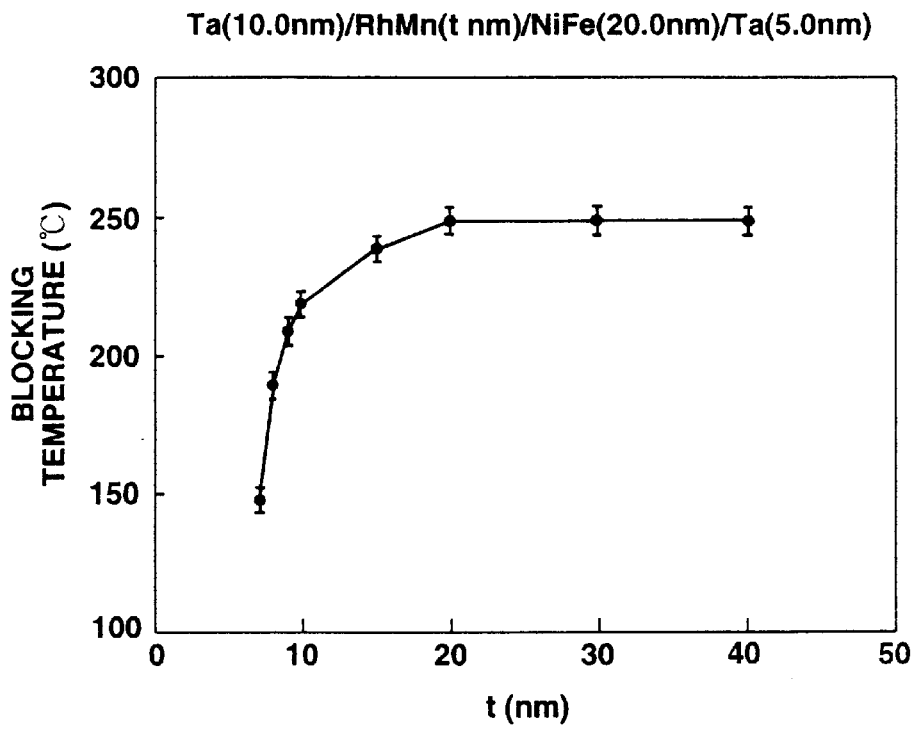
FIG. 10 shows the relationship between the thickness of the antiferromagnetic layer and the blocking temperature.

The blocking temperature of the antiferromagnetic layer 3 varies depending on the volume of the antiferromagnetic layer 3. The relationship between the blocking temperature and the volume was checked by using a magnetic film having an antiferromagnetic layer (RhMn) having modified volumes and a ferromagnetic layer (NiFe). Note that this magnetic film is sandwiched between a Ta layer of 10.0 nm thickness on the ferromagnetic layer and a Ta layer of 5.0 nm thickness under the ferromagnetic layer. The blocking temperature of this RhMn antiferromagnetic layer changes depending on its thickness t (nm) as shown in FIG. 10. As can be understood from this FIG. 10, the blocking temperature of the RhMn antiferromagnetic layer is about 225° C. or above when the layer has a thickness greater than 10.0 nm.

In the case of the GMR device used in the test of FIG. 9, the RhMn antiferromagnetic layer 3 also shows the blocking temperature of about 225° C. when the thickness is greater than 10.0 nm.

Consequently, if the thermal treatment for defining the axis of easy magnetization of the second ferromagnetic layer 6 when the RhMn antiferromagnetic layer 3 has a thickness greater than 10.0 nm, the temperature functions as the blocking temperature of the RhMn antiferromagnetic layer 3. Therefore, in this case, it is impossible to carry out thermal treatment for defining the direction of the exchange coupling magnetic field of the antiferromagnetic layer 3.

This means that the thickness of the RhMn antiferromagnetic layer 3 is preferably 10.0 nm or below. When the RhMn antiferromagnetic layer 3 has a thickness of 10.0 nm or below, the RhMn antiferromagnetic layer 3 has the blocking temperature at 225° C. or below, i.e., there is a temperature difference from the thermal treatment temperature for defining the axis of easy magnetization of the second ferromagnetic layer 6. Consequently, in this case, it is possible to carry out the thermal treatment for defining the exchange coupling magnetic field of the antiferromagnetic layer 3 at a temperature which is below the thermal treatment temperature for defining the axis of easy magnetization of the second ferromagnetic layer 6 and which is above the blocking temperature of the antiferromagnetic layer 3. Thus, in the GMR device 1, it is possible to realize that the magnetization direction of the second ferromagnetic layer intersects the magnetization direction of the antiferromagnetic layer 3 approximately orthogonally and that the second ferromagnetic layer 6 has a small coercive force.

Here, two types of the GMR device 1 were prepared with variation of the thickness of the antiferromagnetic layer 3: one with thickness of 10.0 nm and the other with thickness of 40.0 nm, and with the same structure in the remaining layers: a protection layer 2 (Ta) of 10.0 nm thickness; a first ferromagnetic layer 4 (CoFe) of 2.2 nm thickness; a nonmagnetic layer 5 (Cu) of 2.5 nm thickness; a second ferromagnetic layer 6 consisting of a CoFe layer of 2.0 nm thickness and a NiFe layer of 6.3 nm thickness; and a bottom layer 7 (Ta) of 5.0 thickness. Each of these GMR devices 1 was checked in magnetoresistance change for an external magnetic field. The results are shown in FIG. 11.

Figure 11:
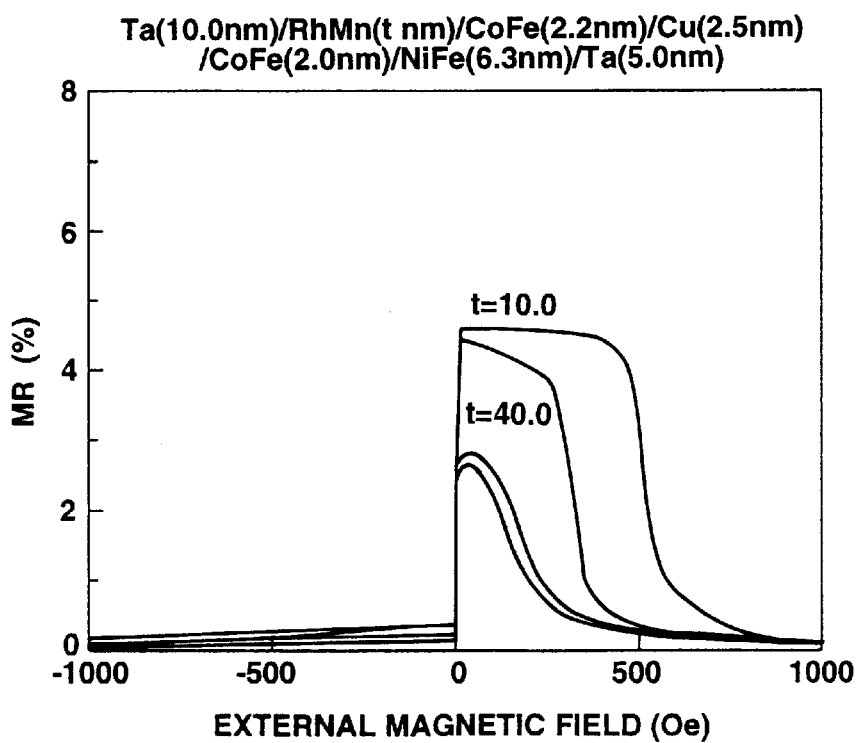
FIG. 11 shows the magnetoresistance change according to the external magnetic field in an antiferromagnetic layer of 10.0 nm thickness and in an antiferromagnetic layer of 40.0 nm thickness.

As can be understood from this FIG. 11, the GMR device 1 having the antiferromagnetic layer of 10.0 nm thickness shows a greater magnetoresistance change for an external magnetic field, compared to the GMR device 1 having the antiferromagnetic layer 3 of 40.0 nm thickness. This is because in the GMR device 1 having the 10.0 nm thickness of the antiferromagnetic layer 3, when no external magnetic field is applied, the magnetization of the first ferromagnetic layer 4 approximately orthogonally intersects the magnetization of the second ferromagnetic layer 6, and the antiferromagnetic layer 3 sufficiently fixes the magnetization of the first ferromagnetic layer 4. On the other hand, in the GMR device 1 having the 40.0 nm thickness of the antiferromagnetic layer 3, the antiferromagnetic layer 3 is not capable of sufficiently fix the first ferromagnetic layer 4, and the magnetization of the first ferromagnetic layer 4 is changed by an external magnetic field together with the magnetization of the second ferromagnetic layer 6.

Moreover, GMR devices 1 with modified thickness "t" of the antiferromagnetic layer 3 were prepared to check the relationship between the thickness of the antiferromagnetic layer 3 and the magnetoresistance change. The GMR devices used in this test have same structure in the remaining layers: a protection layer 2 (Ta) of 10.0 nm thickness; a first ferromagnetic layer 4 (CoFe) of 2.2 nm thickness; a nonmagnetic layer 5 (Cu) of 2.5 nm thickness; a second ferromagnetic layer 6 consisting of a CoFe layer of 2.0 nm thickness and a NiFe layer of 6.3 nm thickness; and a bottom layer 7 (Ta) of 5.0 thickness. The GMR devices used were prepared so that the magnetization of the first ferromagnetic layer 4 is in the same direction of the magnetization of the second ferromagnetic layer 6. When measuring the magnetoresistance change, a magnetic field of several Oe's was applied to move only the magnetization of the second ferromagnetic layer 6, whereas the magnetization of the first ferromagnetic layer 1 is fixed.

That is, in this test, the magnetoresistance was changed only by changing the magnetization of the second ferromagnetic layer 6, leaving the magnetization of the first ferromagnetic layer 4 unchanged. The results of this test are shown in FIG. 12.

Figure 12:
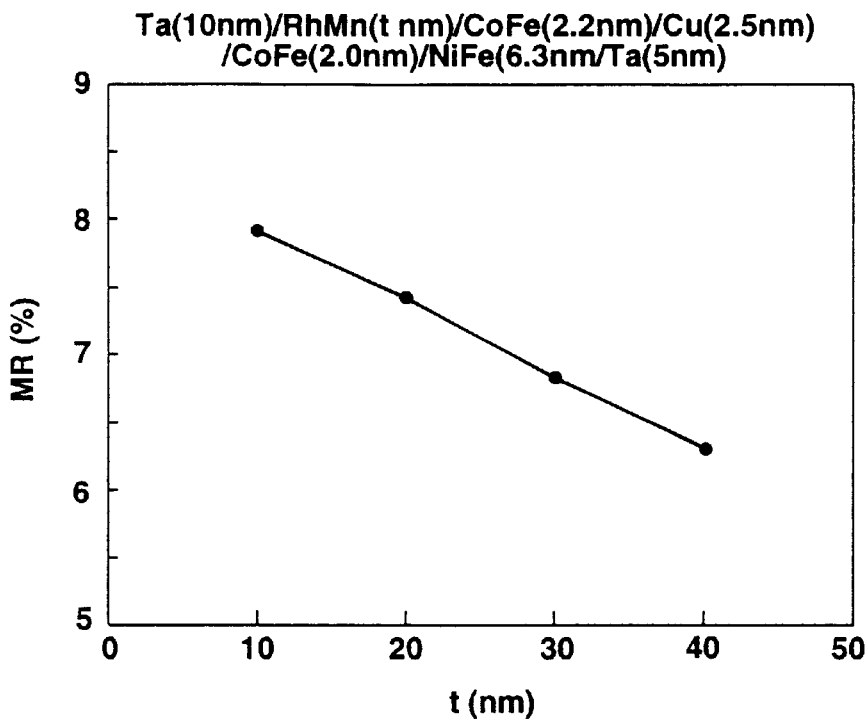
FIG. 12 shows the relationship between the thickness of the antiferromagnetic layer and the magnetoresistance change.

FIG. 12 shows that as the thickness of the antiferromagnetic layer 3 increases, the magnetoresistance change of the GMR device 1 is decreased. This can be explained as follows. When detecting a resistance value, the current supplied to the GMR device 1 partially flows to the antiferromagnetic layer 3 and the current supplied to the nonmagnetic layer 5 is relatively decreased. Consequently, when the antiferromagnetic layer 3 has a thickness of 10 nm or below, the GMR device 1 shows a preferable magnetoresistance effect.

On the other hand, as shown in FIG. 10, the antiferromagnetic layer 3 made from RhMn shows the blocking temperature in the order of about 100° C. when the layer thickness is smaller than 7 nm. For example, when using this GMR device 1 in a magnetic head, it is considered that the GMR device 1 increases its temperature up to about 100° C. In this case, the RhMn antiferromagnetic layer 3 is heated to the blocking temperature, exhibiting super para magnetism. As a result, the RhMn antiferromagnetic layer 3 cannot generate the exchange coupling magnetic field for fixing the magnetization of the first ferromagnetic layer 4. Consequently, if the RhMn antiferromagnetic layer 3 has a thickness smaller than 7 nm, it is impossible to sufficiently fix the magnetization of the first ferromagnetic layer 4 and the first ferromagnetic layer 4 changes its magnetization direction for the external magnetic field. That is, the GMR device 1 cannot show a preferable sensitivity for an external magnetic field.

Therefore, it is preferable that the RhMn antiferromagnetic layer 3 have a thickness of 7.0 nm or above. When the RhMn antiferromagnetic layer 3 has a thickness of 7.0 nm or above, the RhMn antiferromagnetic layer 3 shows a blocking temperature of 100° C. or above and always can generate an exchange coupling magnetic field sufficient for fixing the first ferromagnetic layer 4. Thus, the GMR device 1 is stable for a heat and exhibits a preferable sensitivity for an external magnetic field.

The GMR device 1 thus constructed, in which the antiferromagnetic layer 3 has a composition $A_X Mn_{1-X}$ (wherein A is at least Rh or Ru; and X is in a range from 0.05 to 0.25), especially when the antiferromagnetic layer 3 is made from RhMn and has a thickness in a range from about 7 nm to 10 nm, it is possible to apply a sufficient exchange coupling magnetic field to the first ferromagnetic layer 4 so as to fix the magnetization direction of the first ferromagnetic layer 4, and it is also possible to reduce the size.

Furthermore, the GMR device 1 having an antiferromagnetic layer 3 made from a Rh-Mn alloy or a Ru-Mn alloy retains the antiferromagnetic order and has a magnetic property not deteriorated even at a high temperature. Consequently, this GMR device 1, even supplied with a current to reach a high temperature, retains the antiferromagnetic order of the antiferromagnetic layer 3 and a sufficient exchange coupling magnetic field is applied to the first ferromagnetic layer 4. That is, the GMR device 1 can be used in practice even in an environment in which the temperature is increased during a use.

Figure 13:
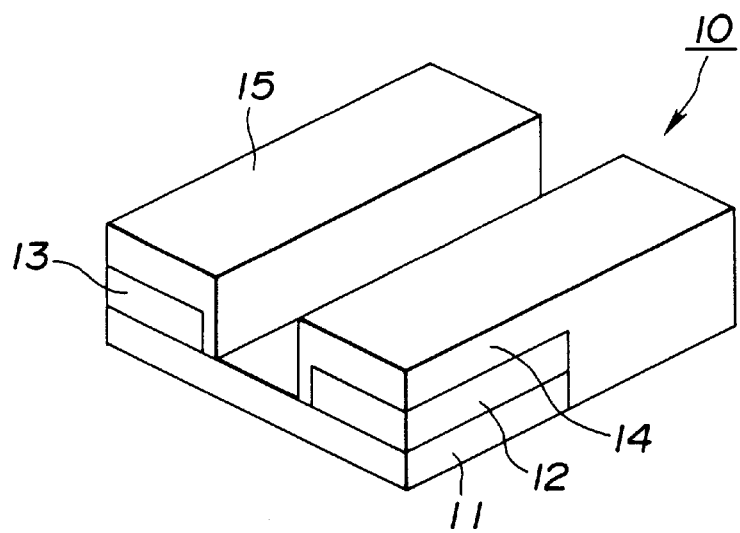
FIG. 13 is a perspective view of an AMR device according to an embodiment of the present invention.

Description will now be directed to a case in which the aforementioned magnetic film consisting of an antiferromagnetic layer and a ferromagnetic layer is applied to an AMR device 10 as shown in FIG. 13.

The AMR device 10 includes: a ferromagnetic layer 11 made from a substance having an anisotropic magnetoresistance effect; a pair of antiferromagnetic layers 12 and 13 formed on the both ends of this ferromagnetic layer 11; and a pair of electrodes 14 and 15 formed on the antiferromagnetic layers 12 and 13, so as to detect a signal generated by a change in resistance of the ferromagnetic layer 11.

The antiferromagnetic layer 12 and 13 have a composition of $A_X—Mn_{1-X}$ (wherein A is at least Rh or Ru; and X is in a range from 0.05 to 0.25).

The AMR device 10 thus constructed has the ferromagnetic layer 11 having an anisotropic magnetoresistance effect and the pair of antiferromagnetic layers 12 and 13 formed at the both ends thereof, so as to carry out domain control of the ferromagnetic layer 11, enabling to obtain a single domain. Consequently, this AMR device 10 can reduce the Barkhausen noise caused by movement of a magnetic wall in the ferromagnetic layer 11.

Because this AMR device 10 has the antiferromagnetic layers 12 and 13 which are made from a Rh-Mn alloy or a Ru-Mn alloy, retains the antiferromagnetic order the magnetic property will not be deteriorated even at a high temperature. Consequently, the AMR device 10, even when supplied with a current to reach a high temperature, retains the antiferromagnetic order of the antiferromagnetic layers 12 and 13, and a sufficient exchange coupling magnetic field can be applied to the ferromagnetic layer 11. That is, This AMR device can be used in practice even in an environment in which the temperature is increased during a use.

Figure 14:
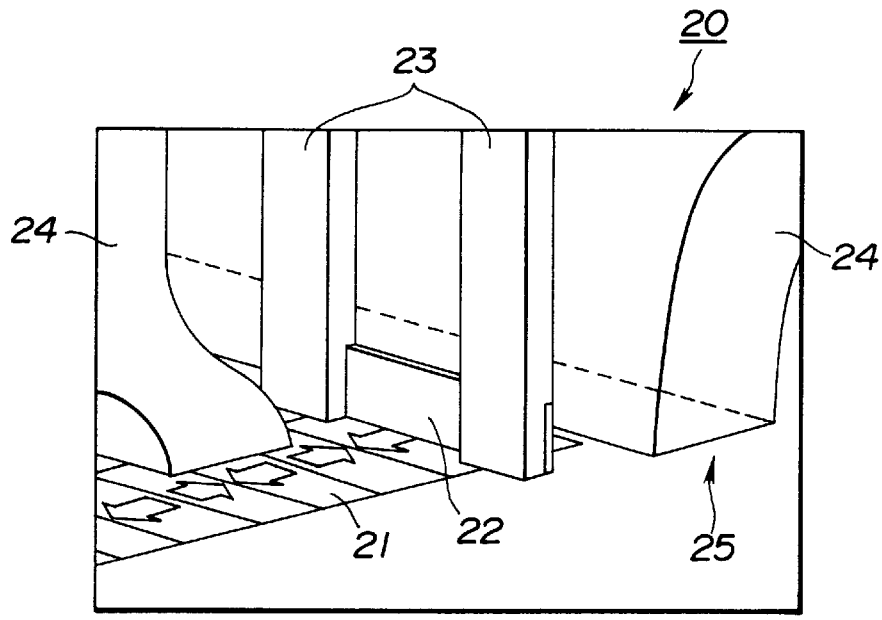
FIG. 14 is a perspective view of a magnetic head provided with a magnetoresistance effect device according to an embodiment of the present invention.

The MR device such as the aforementioned GMR device 1 and the AMR device 10 is provided in a magnetic head 20 of magnetoresistance effect type as shown in FIG. 14.

The magnetic head 20 shown in this FIG. 14 includes: an MR device 22 for reproducing a data signal recorded on a magnetic recording medium 21; a pair of electrodes 23 for detecting a resistance change of the MR device 22 provided at the both ends of the MR device 22; and a magnetic shield 24 for shielding an external magnetic field which may cause a noise in the MR device 22.

The magnetic head 20 thus constructed has an air bearing surface (ABS) 25. This ABS surface 25 scans the magnetic recording medium 21 via a small air gap so that a leak magnetic flux from the magnetic recording medium 21 is detected by the MR device 22, thus reproducing a data signal magnetically recorded on the magnetic recording medium 21.

For example, when the MR device 22 of the magnetic head 20 shown 20 is the GMR device 1 shown in FIG. 8, the antiferromagnetic layer 3 of the GMR device 1 is made from a Rh-Mn alloy or Ru-Mn alloy which exhibit an excellent corrosion resistance, the GMR device 1 will not be corroded due to oxidation or the like during a manufacturing process of the MR head. Moreover, while a current is applied to this magnetic head 20, the antiferromagnetic layer 3 retains the antiferromagnetic order, enabling to apply a stable exchange coupling magnetic field to the first ferromagnetic layer 4.

Moreover, when the antiferromagnetic layer 3 has a composition of $A_X—Mn_{1-X}$ (wherein A is at least Rh or Ru; and X is in a range from 0.05 to 0.25), a sufficient exchange coupling magnetic field can be applied to the adjacent first ferromagnetic layer 4 for fixing the magnetization direction thereof.

Furthermore, the antiferromagnetic layer 3 can be formed with a small thickness, the GMR device 1 can be formed with a small thickness Consequently, the magnetic head 20 using such GMR device 1 can reduce the spacing of the magnetic shield 24, which enables to reproduce a data signal corresponding to a magnetic recording medium of a higher density.

Still further, when the antiferromagnetic layer 3 made from RhMn has a thickness of 7 to 10 nm, it is possible to sufficiently fix the magnetization of the first ferromagnetic layer 4 as has been described above, as well as to control the second ferromagnetic layer 6 so as to have a small coercive force. Moreover, in the case of the GMR device 1, the exchange coupling magnetic field generated from the antiferromagnetic layer 3 will not be deteriorated by a heat, enabling to fix a stable magnetization of the first ferromagnetic layer 4

Figure 15:
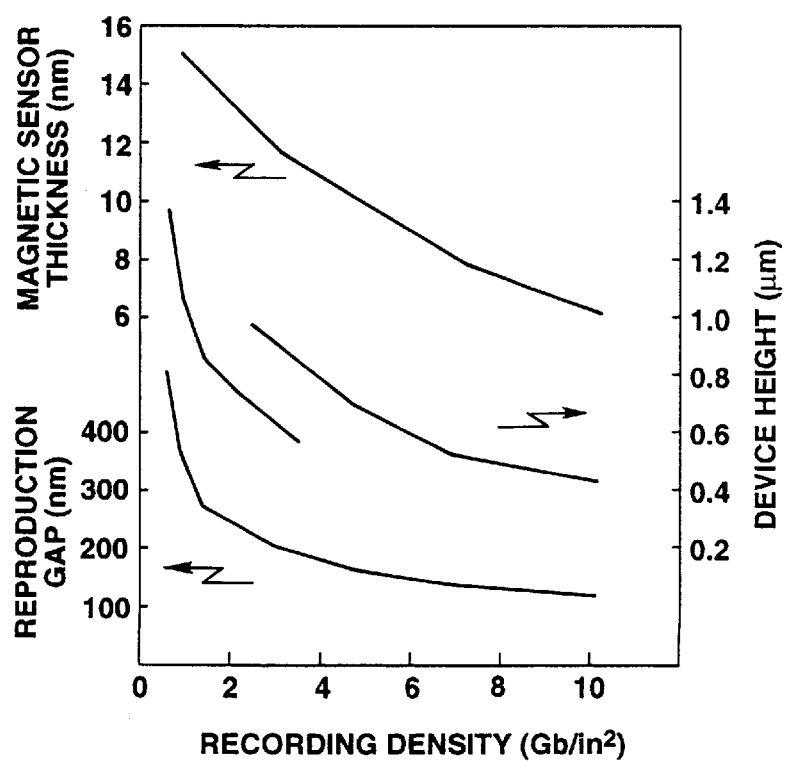
FIG. 15 shows the relationship of the recording density with the GMR device height, reproduction gap length, and magnetic sensor thickness.

Bedsides this, in the GMR 1 which has a RhMn antiferromagnetic layer having a thickness of from 7 to 10 nm, it is possible to make the magnetic head 20 itself to be thin. For example, in the case of a high density recording such as 10 $Gb/in^2$, as shown in FIG. 15, a reproduction gap size, i.e., a space between the magnetic shields 24 is in the order of 10 nm. In this case, if at least 30 nm is required for ensuring insulation between the magnetic shield 24 and the GMR device 1, the thickness of the GMR device 1 itself should be in the order of about 40 nm. As has been described above, the GMR device 1 can have a small thickness of the antiferromagnetic layer 3 as 7 to 10 nm, it is possible to reduce the entire thickness to be in the order of 40 nm. Consequently in the magnetic head using the GMR device 1, it is possible to reproduce a signal from the magnetic recording medium 21 of high density recording.

In the case when the MR device 22 of the magnetic head 20 shown in FIG. 14 is the AMR device 10 shown in FIG. 13, the antiferromagnetic layer 11 of the AMR device 10 is made from a Rh-Mn alloy or Ru-Mn alloy which exhibit an excellent corrosion resistance, the AMR device 10 will not be corroded due to oxidation or the like during a manufacturing process of the MR head. Moreover, while a current is applied to this magnetic head 20, the antiferromagnetic layers 12 and 13 retain the antiferromagnetic order, enabling to carry out stable domain control in the ferromagnetic layer 11.

Moreover, when the antiferromagnetic layers 12 and 13 have a composition of $A_X$—$Mn_{1-X}$ (wherein A is at least Rh or Ru; and X is in a range from 0.05 to 0.25), it is possible to control the magnetization of the ferromagnetic layer 11 with the exchange coupling magnetic field obtained from the antiferromagnetic layers 12 and 13, thus ensuring to obtain a single domain.

Furthermore, the antiferromagnetic layers 12 and 13 can be formed with a small thickness, the AMR device 10 can be formed with a small thickness. Consequently, the magnetic head 20 using such AMR device 10 can reduce the spacing of the magnetic shield 24, which enables to reproduce a data signal corresponding to a magnetic recording medium of a higher density.

It should be noted that this magnetic head of magnetoresistance effect type can also be used in combination with a magnetic head of electromagnetic induction type, so as to form a composite type head in which the magnetic head of magnetoresistance effect type is used as a reproduction head and the magnetic head of electromagnetic induction type is used as a recording head.

Figure 16:
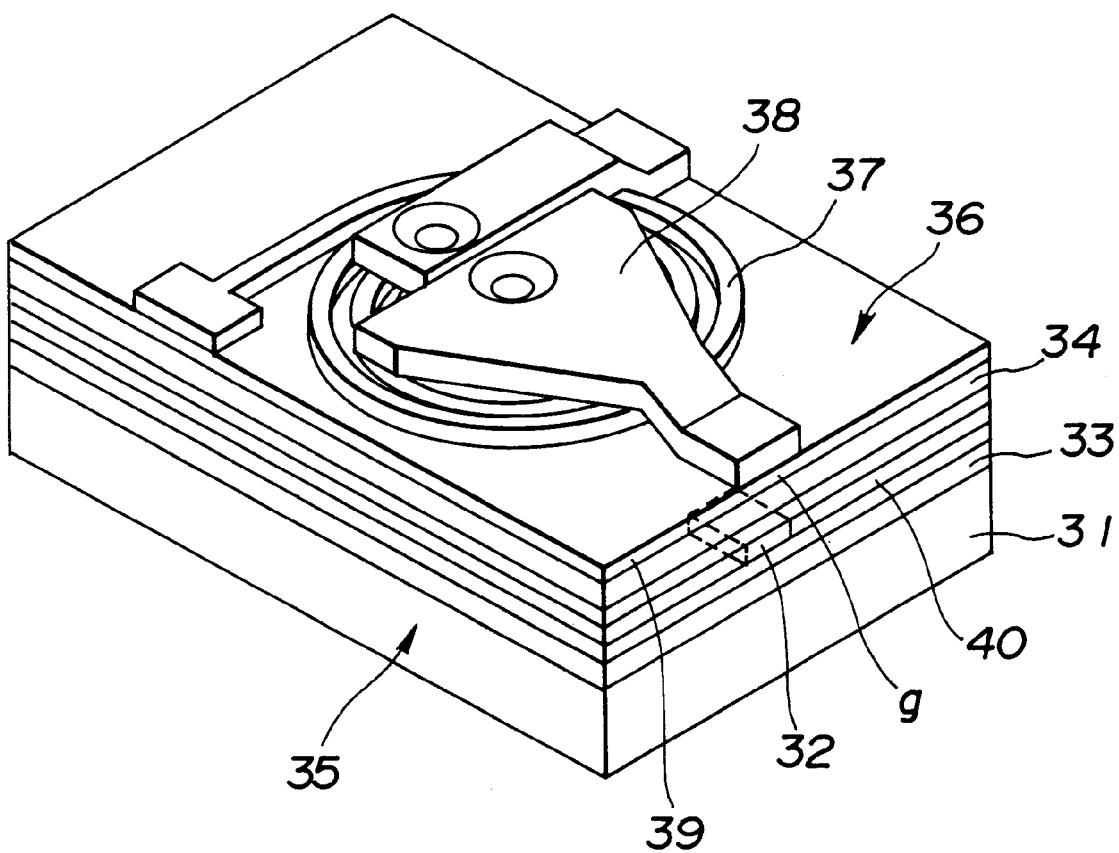
FIG. 16 is a perspective view of a composite type provided with a magnetoresistance effect device according to an embodiment of the present invention.

The composite type head, as shown in FIG. 16, includes a magnetoresistance effect type magnetic head 35 having an MR device 32 sandwiched between a pair of magnetic shields 33 and 34 formed on a substrate 31; and an electromagnetic induction type magnetic head 36 formed thereon.

The electromagnetic induction type magnetic head 36 makes the upper magnetic shield 34 of the magnetoresistance effect type magnetic head 35 function as a lower magnetic core of the electromagnetic induction type magnetic head 36. On this lower magnetic core 34, there are provided a conductive coil 37 of a spiral shape and an upper magnetic core 38. Note that a gap film 39 is provided between the lower magnetic core 34 and the upper magnetic core 38, and this gap film 39 forms a recording gap g on an ABS surface 40.

In such a composite type magnetic head, during a recording, a magnetic flux generated in the conductive coil 37 by applying a signal current passes through the lower magnetic core 34 and the upper magnetic core 38, so as to form a recording magnetic field in the recording gap g. This recording magnetic field magnetizes a small region of the magnetic recording medium, so that a data signal is recorded as a magnetic signal. During a reproduction, a leak magnetic flux from the magnetic recording medium is detected by the MR device 32, thus reproducing the data signal magnetically recorded on the magnetic recording medium.

In such a composite type magnetic head, by using a Rh-Mn alloy or Ru-Mn alloy of a predetermined composition range as the antiferromagnetic layer of the MR device 32, it is possible to improve the corrosion resistance of the antiferromagnetic layer as well as to control the MR device 32 in a preferable magnetization state while maintaining the thickness of the antiferromagnetic layer at a comparatively small value. Consequently, it is possible to reproduce a data signal corresponding to a magnetic recording medium of a higher density.

As has thus far been described, the magnetresistance effect device according to the present invention employs an antiferromagnetic substance made from $A_X$—$Mn_{1-X}$ (wherein A is at least one of Rh and Ru; and X is in a range from 0.05 to 0.25) as an antiferromagnetic body for controlling the magnetization state of a ferromagnetic body, and it is possible to apply a great exchange coupling magnetic field to the ferromagnetic body. Moreover, The antiferromagnetic body made from a Rh-Mn alloy or Ru-Mn alloy cannot be oxidized easily, exhibiting an excellent corrosion resistance. Furthermore, the antiferromagnetic body made from a Rh-Mn alloy or Ru-Mn alloy can be formed as a thin film, thus enabling to obtain a magnetoresistance effect device of a small size.

Moreover, the magnetic head according to the present invention is provided with a magnetoresistance effect device in which a magnetization state of a ferromagnetic body is controlled by an antiferromagnetic body made from $A_X$—$Mn_{1-X}$ (wherein A is at least one of Rh and Ru; and X is in a range from 0.05 to 0.25). The antiferromagnetic body made from a Rh-Ma alloy or Ru-Mn alloy for used in this magnetoresistance effect device is capable of applying a stable and great exchange coupling magnetic field for the ferromagnetic body and exhibits an excellent corrosion resistance. Consequently, the magnetic head according to the present invention using the magnetoresistance effect device in which a magnetization state is controlled by the antiferromagnetic body made from a Rh-Mn alloy or Ru-Mn alloy will not be oxidized, deteriorating the characteristic of the magnetoresistance effect device during a manufacturing process.

Furthermore, the antiferromagnetic body made from a Rh-Mn alloy or Ru-Mn alloy can be formed as a thin film and accordingly, it is possible to form in a small size the magnetoresistance effect device in which a magnetization state is controlled by the antiferromagnetic body made from a Rh-Mn alloy or a Ru-Mn alloy. Consequently, the magnetic head employing such a magnetoresistance effect device can reduce a space between magnetic shields, enabling to cope with a magnetic recording medium of a higher density.

What is claimed is:

1. A magnetoresistance effect device comprising an antiferromagnetic body and a ferromagnetic body, magnetization of said ferromagnetic body is controlled by said antiferromagnetic body, said antiferromagnetic body having a composition of $A_X$—$Mn_{1-X}$, wherein A is selected from the group of Rh and Ru; and X is in the range from 0.05 to 0.25.

2. A magnetoresistance effect device as claimed in claim 1, wherein said antiferromagnetic body has a face-centered cubic structure.

3. A magnetoresistance effect device as claimed in claim 1, wherein said antiferromagnetic body is in an irregular phase.

4. A magnetoresistance effect device as claimed in claim 1, wherein said antiferromagnetic body contains as an additional element at least one element selected from a group consisting of Ir, Pt, Pd, Ni, Cu, Os, Re, and Cr.

5. A magnetoresistance effect device as claimed in claim 1, wherein said ferromagnetic body comprises at least a first ferromagnetic layer whose magnetization direction is fixed by said antiferromagnetic body, a non-magnetic layer, and a second ferromagnetic layer whose magnetization direction is changed by an external magnetic field.

6. A magnetoresistance effect device as claimed in claim 5, wherein said antiferromagnetic body is made from $Rh_X$—$Mn_{1-X}$ wherein X is in a range from 0.05 to 0.25 and has a thickness from 7 nm to 10 nm.

7. A magnetoresistance effect device as claimed in claim 1, wherein said ferromagnetic body is made from a magnetic material having the anistoropic magnetoresistance effect.

8. A magnetic head comprising a magnetoresistance effect device having an antiferromagnetic body and a ferromagnetic body whose magnetization state is controlled by said antiferromagnetic body, wherein said antiferromagnetic body has a composition of $A_X$—$Mn_{1-X}$ wherein A is selected from the group of Rh and Ru, and X is in a range from 0.05 to 0.25.

9. A magnetic head as claimed in claim 8, wherein said ferromagnetic body comprises at least a first ferromagnetic layer whose magnetization direction is fixed by said antiferromagnetic body, a non-magnetic layer, and a second ferromagnetic layer whose magnetization direction is changed by an external magnetic field.

10. A magnetic head as claimed in claim 9, wherein said antiferromagnetic body is made from $Rh_X$—$Mn_{1-X}$ wherein X is in a range from 0.05 to 0.25, and has a thickness from 7 nm to 10 nm.

11. A magnetic head as claimed in claim 8, wherein said ferromagnetic body is made from a magnetic material having the anisotropic magnetoresistance effect.

* * * * *